(12) United States Patent
Yang et al.

(10) Patent No.: US 10,997,888 B2
(45) Date of Patent: *May 4, 2021

(54) DISPLAY PANEL AND DISPLAY DEVICE INCLUDING THE SAME

(71) Applicant: Shanghai Tianma AM-OLED Co., Ltd., Shanghai (CN)

(72) Inventors: Yang Yang, Shanghai (CN); Bojia Lv, Shanghai (CN); Xiangzi Kong, Shanghai (CN); Gaojun Huang, Shanghai (CN); Di Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/573,098

(22) Filed: Sep. 17, 2019

(65) Prior Publication Data

US 2020/0342799 A1 Oct. 29, 2020

(30) Foreign Application Priority Data

Apr. 26, 2019 (CN) .......................... 201910347232.7

(51) Int. Cl.
*H01L 27/12* (2006.01)
*G09G 3/20* (2006.01)
*H01L 27/148* (2006.01)

(52) U.S. Cl.
CPC .......... *G09G 3/20* (2013.01); *H01L 27/1218* (2013.01); *H01L 27/14812* (2013.01); *G09G 2300/0426* (2013.01); *G09G 2300/08* (2013.01); *G09G 2310/0221* (2013.01); *G09G 2310/0267* (2013.01); *G09G 2310/0283* (2013.01); *G09G 2310/08* (2013.01); *G09G 2380/02* (2013.01)

(58) Field of Classification Search
CPC .......... H01L 27/1281; H01L 27/14812; H01L 27/1218; G09G 3/20; G09G 2300/0426; G09G 2300/08; G09G 2310/0221; G09G 2310/0267; G09G 2310/0283; G09G 2310/08; G09G 2380/02

See application file for complete search history.

(56) References Cited

U.S. PATENT DOCUMENTS

2020/0135763 A1* 4/2020 Wu .................... H01L 27/1218
2020/0135832 A1* 4/2020 Ma .................... H01L 27/14812

\* cited by examiner

*Primary Examiner* — Abdul-Samad A Adediran
(74) *Attorney, Agent, or Firm* — Tarolli, Sundheim, Covell & Tummino LLP

(57) ABSTRACT

A display panel has a display area and a non-display area surrounding the display area. The display area has a first side and a second side opposite to the first side, and includes: a hollow area having first and second edges; and first to third display areas. The display panel includes: a driving chip arranged in the non-display area closer to the first side than to the second side; first data lines arranged in the first display area; second data lines arranged in the second display area; and third data lines arranged in the third display area. The first edge is closer to the driving chip than the second edge. At least one or more of the first data lines is connected to corresponding one or more of the second data lines through a switch unit.

21 Claims, 9 Drawing Sheets

DISPLAY PANEL AND DISPLAY DEVICE INCLUDING THE SAME

CROSS-REFERENCE TO RELATED APPLICATIONS

The present disclosure claims priority to Chinese Patent Application No. 201910347232.7, filed on Apr. 26, 2019, the content of which is incorporated herein by reference in its entirety.

TECHNICAL FIELD

The present disclosure relates to the technical field of display technologies, and in particular, to a display panel and a display device including the same.

BACKGROUND

With the consumption upgrade, the consumer' desire for the display panel is no longer limited to a display panel of a rectangular shape, a circular shape or the like regular shape, but requires a display area of the display panel to have a shape meeting practical needs. For example, in order to achieve the higher screen-to-body ratio for a display panel of a mobile phone while receiving devices such as a front camera, an earpiece, a light sensor and the like, a part of the display panel is cut out to form a special-shaped display panel (or an irregular display panel). However, such a display panel is not the best way to increase the screen-to-body ratio. In order to further increase the screen-to-body ratio, a non-display hole has been provided in a display area of the display panel or on a side surface of the display panel. In this way, data lines may be cut off by the non-display hole. In order to ensure normal transmission of a data signal, it is needed to wind data lines around a periphery of the non-display hole. It is also needed to leave space around the non-display hole for wiring of the wound data lines in the non-display area, which increases an area of the non-display area of the display panel and thus affects increasing of the screen-to-body ratio of the display panel.

SUMMARY

In view of this, the present disclosure provides a display panel and a display device including the display panel, aiming to solve the above technical problems.

In an aspect, an embodiment of the present disclosure provides a display panel, and the display panel has a display area and a non-display area surrounding the display area. The display area has a first side and a second side opposite to the first side, and the display area includes: a hollow area having a first edge and a second edge; a first display area extending from the first side of the display area to the second side of the display area; a second display area extending from the second edge of the hollow area to the second side of the display area; and a third display area extending from the first side of the display area to the first edge of the hollow area. The display panel includes: a driving chip arranged in the non-display area closer to the first side of the display area than to the second side of the display area; first data lines arranged in the first display area; second data lines arranged in the second display area; and third data lines arranged in the third display area. The first edge of the hollow area is closer to the driving chip than the second edge of the hollow area, and at least one or more of the first data lines is connected to corresponding one or more of the second data lines through a switch unit.

In another aspect, an embodiment of the present disclosure provides a display device including the display panel described above.

BRIEF DESCRIPTION OF DRAWINGS

In order to more clearly illustrate technical solutions in embodiments of the present disclosure, the accompanying drawings used in the embodiments and in the related art are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although display areas may be described using the terms of "first", "second", "third" etc., in the embodiments of the present disclosure, the display areas will not be limited to these terms. These terms are merely used to distinguish display areas from one another. For example, without departing from the scope of the embodiments of the present disclosure, a first display area may also be referred to as a second display area, and similarly, a second display area may also be referred to as a first display area.

As described in the background, in order to further increase the screen-to-body ratio, it has been designed to provide a non-display hole in the display area of the display panel or on a side surface of the display panel. In this case, data lines would be cut off by the non-display hole. In order to ensure normal transmission of a data signal, it is needed to provide the data lines around a periphery of the non-display hole. It is also needed to leave space around the non-display hole for wiring of the data lines in the non-display area, which increases an area of the non-display area of the display panel and thus affects increasing of the screen-to-body ratio of the display panel.

Figure 1:
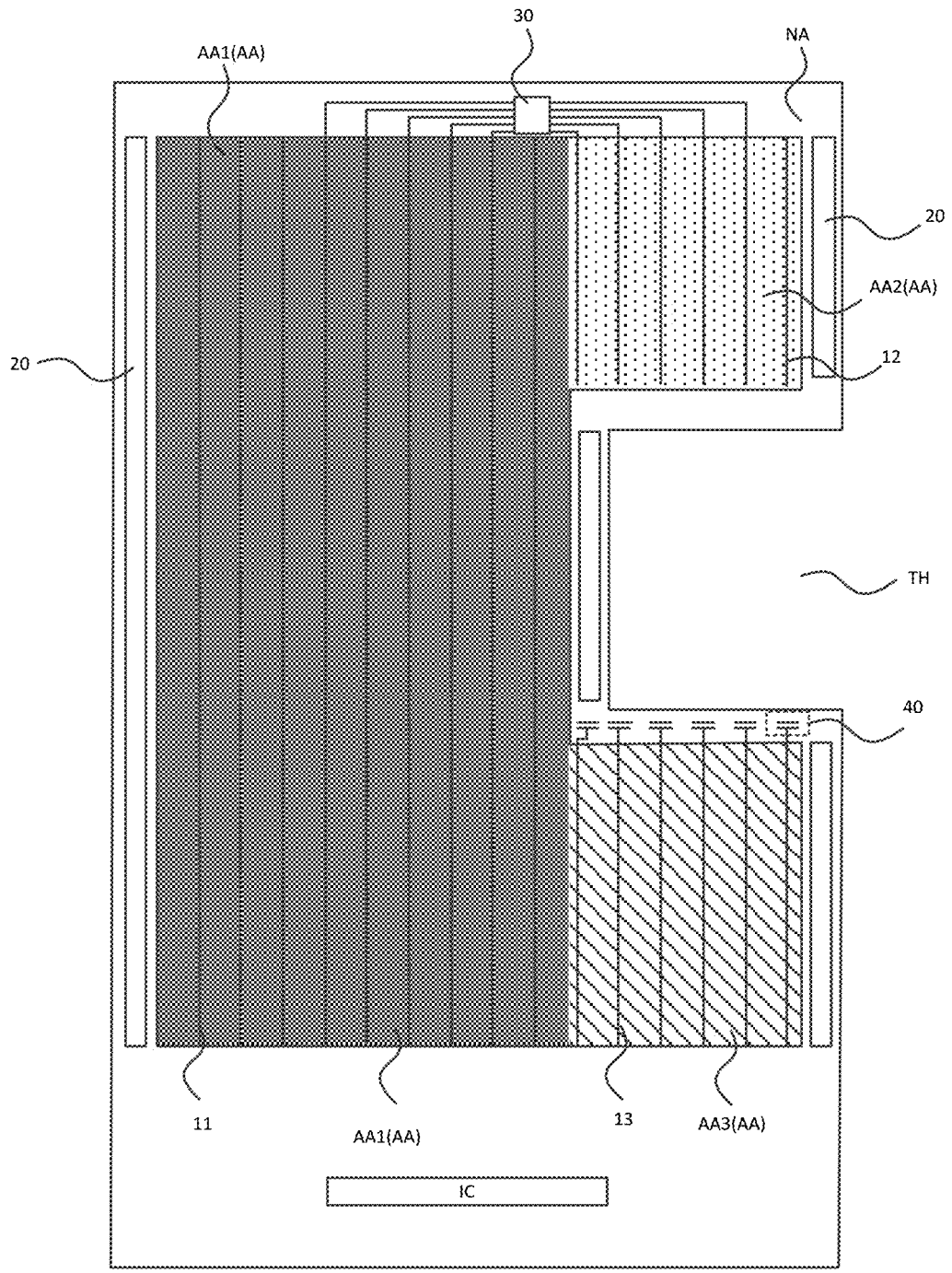
FIG. 1 is a schematic diagram of a display panel according to an embodiment of the present disclosure.

FIG. 1 is a schematic diagram of a display panel according to an embodiment of the present disclosure. With reference to FIG. 1, an embodiment of the present disclosure provides a display panel. The display panel has a display area AA and a non-display area NA surrounding the display area AA. Herein, the display area AA has a first side and a second side opposite to the first side. The display panel includes a driving chip IC, and the driving chip IC is arranged in a part of the non-display panel NA close to the first side of the display area AA. In an example, as shown in FIG. 1, the first side of the display area AA is a lower side of the display area AA, and the second side of the display area is an upper side of the display area AA. The display panel further has a hollow area TH, and the hollow area TH is located in the display area AA. The hollow area TH includes a first edge close to the driving chip IC and a second edge away from the driving chip IC. In an example, as shown in FIG. 1, the first edge of the hollow area TH is a lower edge of the hollow area TH, and the second edge of the hollow area TH is an upper edge of the hollow area TH. In order to increase the screen-to-body ratio of the display panel, the display panel is provided with the hollow area for arrangement of other components of the display device, such as a camera, a receiver, a light sensor and the like. It should be noted that the hollow area TH in the present disclosure may be a non-display area after cutting, or may be a transparent non-display area without cutting.

After the display panel is provided with the hollow area TH, the display panel is divided into three areas. With reference to FIG. 1, the display panel includes: a first display area AA1 extending from the first side of the display area AA to the second side of the display area AA; a second display area AA2 extending from the second edge of the hollow area TH to the second side of the display area AA; and a third display area AA3 extending from the first side of the display area AA to the first edge of the hollow area TH. The first display area AA1 is provided with first data lines 11. The second display area AA2 is provided with second data lines 12. The third display area AA3 is provided with third data lines 13. The first data lines 11, the second data lines 12, and the third data lines 13 are all used to transmit data signals. Since the data signals are provided by the driving chip IC, the data lines such as the first data lines 11 normally extend from the first side of the display area AA to the second side of the display area AA. However, due to the presence of the hollow area TH, the third data lines 13 located in the third display area AA3 cannot extend to the corresponding second display area AA2. If it is needed to provide a data signal to the second display area AA2, the data lines have to be arranged along edges of the hollow area TH, which will result in an increase in borders of edges of the hollow area, thereby reducing the screen-to-body ratio and affecting the visual effect. In the present disclosure, one first data line 11 in at least a part of the first display area AA1 is connected to one second data line 12 by a switch unit 30. The switch unit 30 can transmit a data signal through the first data line 11 to the second data line 12 in a time division manner. When the switch unit 30 is turned on, the driving chip IC transmits the data signal to the second display area AA2 through the first data line 11 connected to the second data line 12. When the switch unit 30 is turned off, the driving chip IC transmits the data signal only to the first display area through the first data line 11. At this time, since the switch unit 30 is turned off, the data signal transmitted to the first display area AA1 does not affect the second display area AA2.

Figure 3:
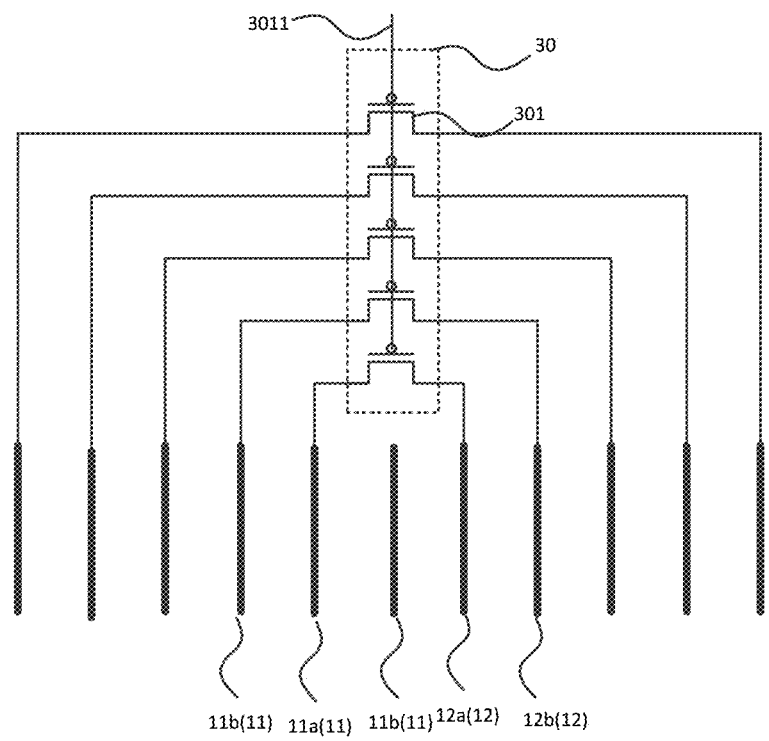
FIG. 3 is a schematic diagram of switch units according to an embodiment of the present disclosure.

FIG. 3 is a schematic diagram of a switch unit according to an embodiment of the present disclosure. With reference to FIG. 3, in an embodiment, the switch unit 30 includes at least one switch transistor 301. Each switch transistor 301 has a first electrode connected to a respective first data line 11, a second electrode connected to a respective second data line 12, and a gate electrode connected to a same control signal line 3011. For example, the switch transistor is a P-type transistor. When the control signal line 3011 provides a low-level control signal, each switch transistor 301 is simultaneously turned on, and the driving chip IC provides a data signal to the second data lines 12 in the second display area AA2 through the first data lines 11 connected to the second data lines 12. When the control signal line 3011 provides a high-level control signal, each switch transistor 301 is simultaneously turned off, and the driving chip IC provides a data signal to the first display area AA1 through the first data lines 11. In this embodiment, with the switch unit 30, the first data lines 11 are reused to transmit a signal to the first display area AA1 and to the second display area AA2, thereby avoiding signal interference between the two display areas. Moreover, the present disclosure avoids winding of the data lines and thus reduces a border width of the hollow area TH.

In another embodiment of the present disclosure, the number of columns of pixels in the second display area may be larger than the number of columns of pixels in the first display area, and the number of the second data lines 12 in the second display area AA2 is larger than the number of the first data lines 11 in the first display area AA1. In this case, according to the foregoing embodiment, there is no corresponding first data line 11 to which some of the second data lines 12 can be connected.

Figure 4:
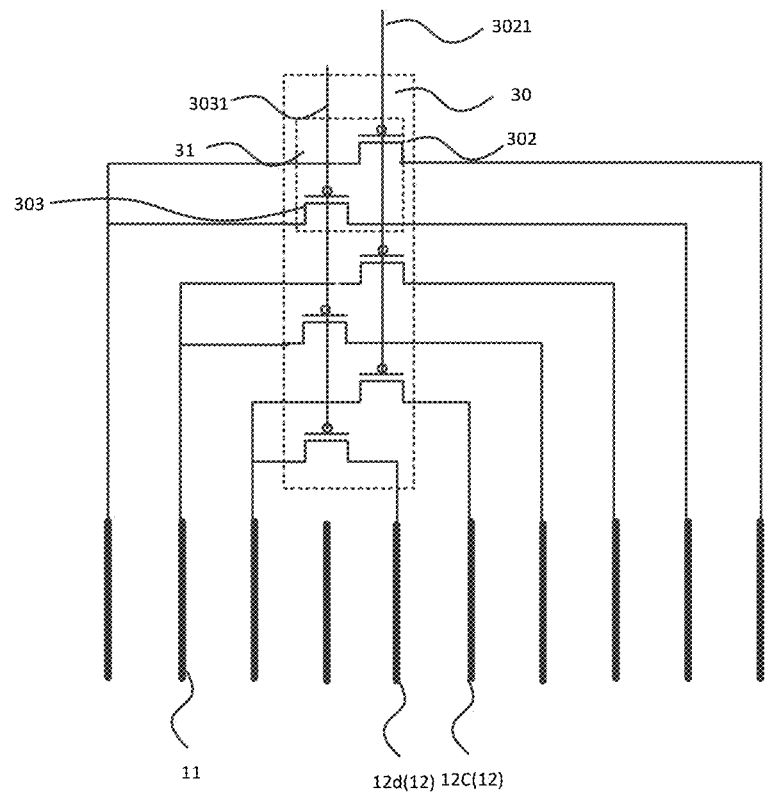
FIG. 4 is a schematic diagram of a switch unit according to another embodiment of the present disclosure.

FIG. 4 is a schematic diagram of a switch unit according to another embodiment of the present disclosure. With reference to FIG. 4, in an embodiment, the switch unit 30 includes at least one multi-path switch unit 31. A multi-path switch unit 31 includes n transistors. One first data line 11 is connected to n second data lines 12 through a respective set of multi-path switch units 31. The multi-path switch unit 31 includes n transistors and n control signal lines. The n transistors each have a first terminal connected to a same first data line 11, a second terminal connected to a respective second data line 12, and a control terminal connected to a respective control signal line. Here, n is an integer larger than or equal to 2. As shown in FIG. 4, the multi-path switch unit 31 of the present disclosure will be described with n=2 as an example. In this embodiment, the multi-path switch unit 31 includes one second transistor 302 and one third transistor 303. The first terminal of the second transistor 302 and the first terminal of the third transistor 303 are connected to a same first signal line 11. The second terminal of the second transistor 302 and the second terminal of the third transistor 303 are respectively connected to two different second data lines 12. The control terminal of the second transistor 302 and the control terminal of the third transistor 303 are respectively connected to two different control signal lines, i.e., a second control signal line 3021 and a third control signal line 3031. Here, it is taken as example that the second transistor 302 and the third transistor 303 are both P-type transistors. When the second control signal line 3021 provides a low-level signal and the third control signal line 3031 provides a high-level signal, the second transistor 302 is turned on and the third transistor 303 is turned off, and at this time, the driving chip IC provides a data signal to the second data line 12 that is connected to the first data line 11 through the second transistor 302. When the second control signal line 3021 provides a high-level signal and the third control signal line 3031 provides a low-level signal, the third transistor 303 is turned on and the second transistor 302 is turned off, and at this time, the driving chip IC provides a data signal to the second data line 12 that is connected to the first data line 11 through the third transistor 303. When the second control signal line 3021 provides a high-level signal and the third control signal line 3031 provides a high-level signal, the second transistor 302 is turned off and the third transistor 303 is turned off, and at this time, the driving chip IC provides a data signal to the first display area AA1 through the first data line 11, and this data signal does not affect normal display of the second display area AA2 since both the second transistor 302 and the third transistor 303 are turned off. In this embodiment, with the switch unit 30, the first data lines 11 are reused to transmit a signal to the first display area AA1 and to the second display area AA2, thereby avoiding signal interference between the two display areas. Moreover, the present disclosure avoids winding of the data lines and thus reduces a border width of the hollow area TH. In addition, in this embodiment, one first data line 11 can transmit a data signal to the second data lines through the switch unit 30 in a time division manner, so that this embodiment is applicable to a broad range of a size of the notch area. For example, when the hollow area is relatively large and the number of second data lines 12 in the second display area AA2 is 1 to 2 times the number of the first data lines 11 in the first display area AA1, n=2 can satisfy a usage requirement of the switch unit. Similarly, when the hollow area is relatively large and the number of the second data lines 12 in the second display area AA2 is 2 to 3 times the number of the first data lines 11 in the first display area AA1, n=3 can satisfy a usage requirement of the switch unit.

Further, since sub-pixels of different colors have different data signals corresponding to light-emitting brightness, if data signals for different colors are to be written into a same data line, data writing time is insufficient, thereby resulting in inaccurate signals and abnormal display. When the first data line 11 and the second data line 12 connected thereto correspond to different colors, for example, the first data line 11 corresponds to red and blue, and the second data line corresponds to green. Since a data signal range for green is greatly different from that for red and blue, for example, the data signal range for green is 3 v to 5 v, and the data signal range for red and blue is 2 v to 3 v, then a data signal is input at the last row (the last row in the time sequence) of the second display area AA2, for example changing from 2 v of a previous row (a second last row in the time sequence) to 2.5 v of the last row. Writing a signal data for the first row (the first row in the time sequence) of the display are AA1 requires for 4 v corresponding to green. Since a voltage difference between 2.5 v and 4 v is much larger than a voltage difference between 2 v and 2.5 v, the data signal writing time thereof may be insufficient, thereby causing abnormal display of the first display area. Therefore, the present embodiment provides a display panel, which can solve the above problems.

With reference to FIG. 3, the first data lines 11 include a first set of first data lines 11a and a second set of first data lines 11b, and a first data line in the first set of first data lines and a first data line in the second set of first data lines are alternately arranged in a first direction. The first set of first data lines 11a and the second set of first data lines 11b are connected to pixels of different colors. The first direction intersects with an extending direction of the first data lines 11. The second data lines 12 include a first set of second data lines 12a and a second set of second data lines 12b that are alternately arranged along the first direction. The first set of second data lines 12a and the second set of second data lines 12b are connected to pixels of different colors. The first set of second data lines 12a are connected to the first set of first data lines 11a through the switch transistors 301, and the second set of second data lines 12b are connected to the second set of first data lines 11b through the switch transistors 301. The first set of second data lines 12a and the first set of first data lines 11a are connected to pixels of a same color. The second set of second data lines 12b and the second set of first data lines 11b are connected to pixels of a same color. In this way, for the second data lines 12 and the first data lines 11 that are connected to each other through the switch unit 30, signals written to the last row of the second display area AA2 and to the first row of the first display area AA1 have a same color. This can avoid insufficient charging time caused by different colors, and thus avoid abnormal display. It should be noted that the above-mentioned the first set of second data lines 12a and the first set of first data lines 11a being connected to pixels of a same color does not mean that the first set of second data lines 12a and the first set of first data lines 11a may be only connected to pixels of one color, instead, the first set of second data lines 12a and the first set of first data lines 11a may be simultaneously connected to pixels of two different colors. For example, the first set of second data lines 12a are connected to red and blue pixels, and first set of first data lines 11a are also connected to red and blue pixels.

Figure 5:
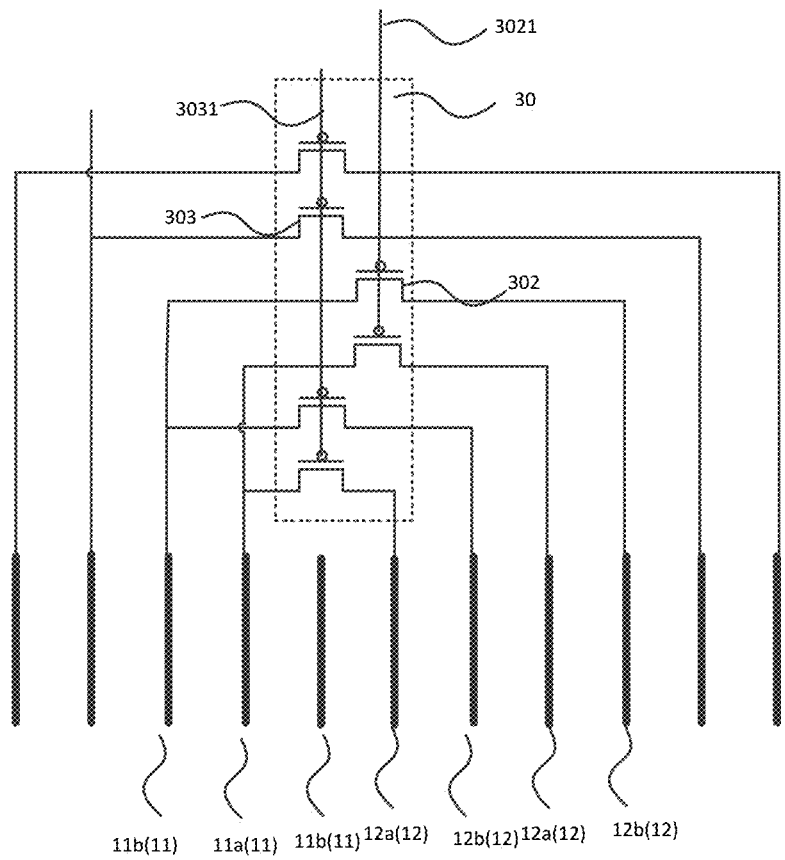
FIG. 5 is a schematic diagram of a switch unit according to still another embodiment of the present disclosure.

Similarly, when the switch unit is the multi-path switch unit shown in FIG. 5, the above technical problem can also be solved by this method. FIG. 5 is a schematic diagram of a switch unit according to still another embodiment of the present disclosure.

The first data lines 11 include a first set of first data lines 11a and a second set of first data lines 11b that are alternately arranged in a first direction, and the first set of first data lines 11a and the second set of first data lines 11b are connected to pixels of different colors. The first direction intersects with an extending direction of the first data lines 11. The second data lines 12 includes a first set of second data lines 12a and a second set of second data lines 12b that are alternately arranged in the first direction, and the first set of second data lines 12a and the second set of second data 12b are connected to pixels of different colors. Here, n second data lines 12a in the first set of second data lines 12a are connected to a respective first data line 11a in the first set of first data lines 11a through a respective multi-path switch unit 31, and n second data lines 12b in the second set of second data lines 12b are connected to a respective first data line 11b in the second set of first data lines 11b through a respective multi-path switch unit 31. Taking n=2 as an example, one first data line 11a in the first set of first data lines 11a is connected to two different second data lines 12a in the first set of second data lines 12a through a second transistor 301 and a third transistor 303. One first data line 11b in the second set of first data lines 11b is connected to two different second data lines 12b in the second set of second data lines 12b through the second transistor 301 and the third transistor 303. The first set of second data lines 12a and the first set of first data lines 11a are connected to pixels of a same color, and the second set of second data lines 12b and the second set of first data lines 11b are connected to pixels of a same color. Similarly, this can avoid insufficient charging time caused by different colors, and thus avoid abnormal display.

Further, the first data lines 11 in the first display area AA1 extend from the first side of the display area AA to the second side of the display area AA, the second data lines 12 in the second display area AA2 are connected to the first data lines 11 in the first display area AA1, but the third data lines in the third display area AA3 extends only from the first side of the display area to the first edge of the hollow area TH. Therefore, a length of the third data line 13 and the number of pixels connected to the third data line 13 are much smaller than those of other data line, which causes its parasitic capacitance to be different from other data lines, thereby resulting in uneven display. In this embodiment, a compensation capacitor 40 connected to the third data line 13 is further provided. The compensation capacitor 40 has a capacitance of C1. A difference between a parasitic capacitance of the first data line 11 and a parasitic capacitance of the third data line 13 is C2. Here, $0.8*C2 \leq C1 \leq 1.2*C2$. The present disclosure provides the compensation capacitor 40 for compensating for a capacitance difference between data lines. Moreover, when a capacitance difference between data lines is within 20%, it is within a tolerance range of charging of the data lines. In this case, display unevenness can be avoided.

A side of the hollow area TH close to the second display area AA2 needs to be provided with a gate driving circuit 20, so as to form a non-display area. In order to balance a width of the non-display area around the hollow area TH, further, referring to FIG. 1, compensation capacitors 40 are arranged at the first edge of the hollow area TH close to the third display area AA3.

Further, in order to avoid intersection of signal lines, the first data lines 11 and the second data lines 12 close to a junction of the first display area AA1 and the second display area AA2 are connected to each other through the switch unit 30, and the first data lines 11 and the second data lines 12 away from this junction are connected to each other through the switch unit 30. In this way, a connection line connecting the first data line 11 and the second data line 12 away from this junction has a longer length, resulting in a different delay in writing a data signal. In this embodiment, a first connection line is provided between a first data line 11 and a corresponding second data line 12 connected to the first data line 11. One of the first connection lines that connects one of the first data lines 11 and a respective one of the second data lines 12 that are close to a junction of the first display area and the second display area has a larger resistance than another of the first connection lines that connects another of the first data lines 11 and a respective one of the second data lines 12 that are away from the junction of the first display area and the second display area. In this way, by adjusting the resistance of the connection line, a connection resistance between each first data line 11 and its corresponding second data line 12 has a same value, thereby avoiding the delay difference caused by different resistances.

Figure 2:
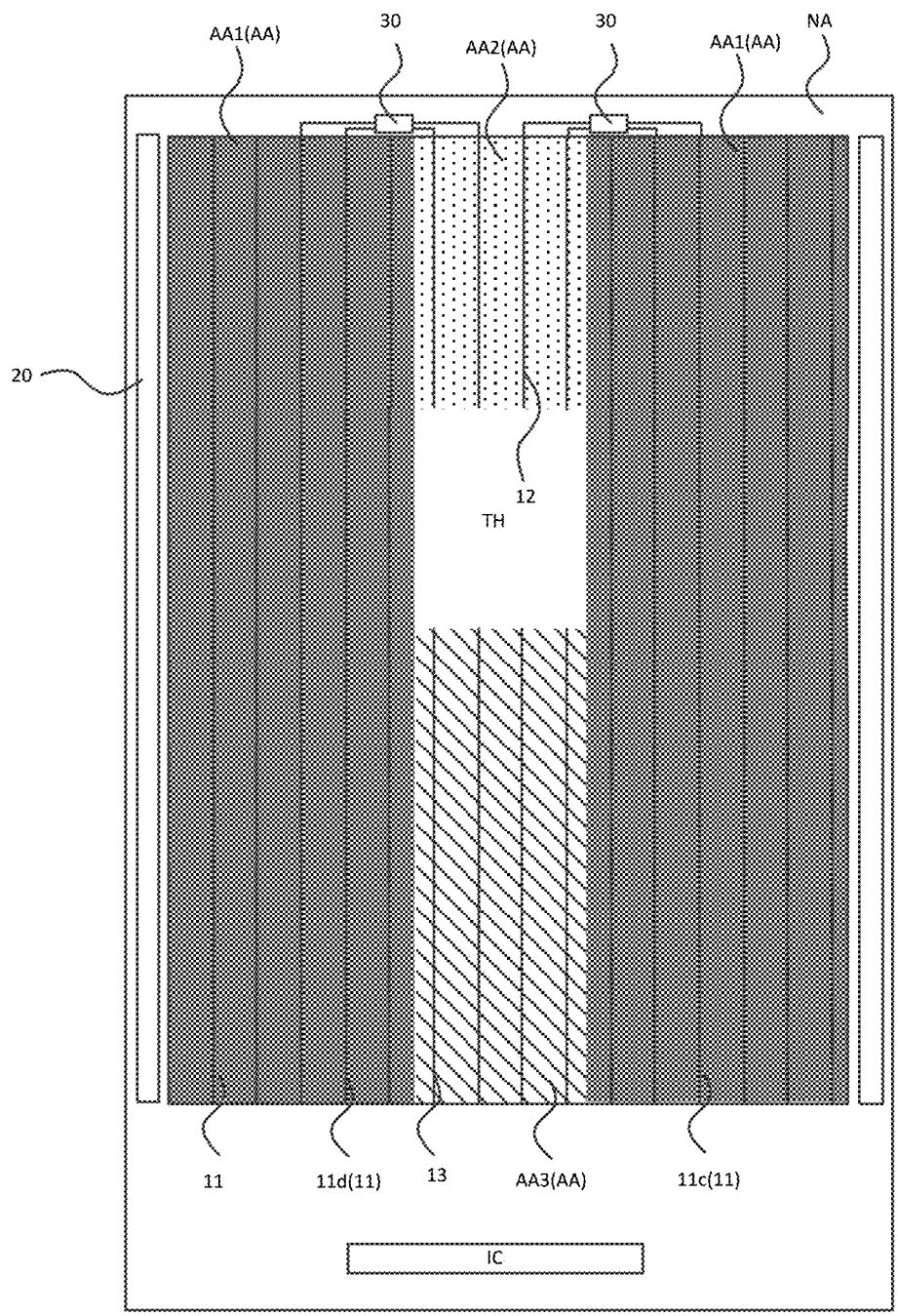
FIG. 2 is a schematic diagram of a display panel according to another embodiment of the present disclosure.

In this embodiment, with reference to FIG. 1 and FIG. 2, the hollow area TH may be arranged at an edge of the display area AA or in the middle of the display area AA.

In an embodiment as shown in FIG. 1, the hollow area TH is arranged at the edge of the display area AA, and the display area AA has a third side adjacent to the first side and the second side, and a fourth side opposite to the third side. The hollow area is arranged at the third side to form a notch area. As shown in FIG. 1, the first side of the display area AA is a lower side of the display area AA, the second side of the display area AA is an upper side of the display area AA, the third side of the display area AA is a right side of the display area AA, and the fourth side of the display area AA is a left side of the display area AA. The hollow area TH is arranged at the fourth side of the display area, i.e., a notch is formed at the fourth side of the display area. In this case, the third display area AA3 is adjacent to the third side, and the third display area AA3 is separated from the fourth side by the first display area AA1.

FIG. 2 is a schematic diagram of a display panel according to another embodiment of the present disclosure. In another embodiment of the present disclosure, with reference to the FIG. 2, the hollow area TH is arranged in the middle of the display area AA. The display area has a third side adjacent to the first side and the second side, and a fourth side opposite to the third side. The hollow area TH is arranged in a middle area of the display area to form a non-display hole. As shown in FIG. 2, the first side of the display area AA is a lower side of the display area AA, the second side of the display area AA is an upper side of the display area AA, the third side of the display area AA is a right side of the display area AA, and the fourth side of the display area AA is a left side of the display area AA. In this case, two switch units 30 are provided. One of the two switch units 30 connects the second data lines in the second display AA2 and the first data lines close to the third side, and the other one of the two switch units 30 connects the second data lines in the second display AA2 and the first data lines close to the fourth side. This can avoid transmitting data signals to the second display area AA2 only from the first data lines 11 on one side, thereby improving the display evenness of the display panel.

Figure 6:
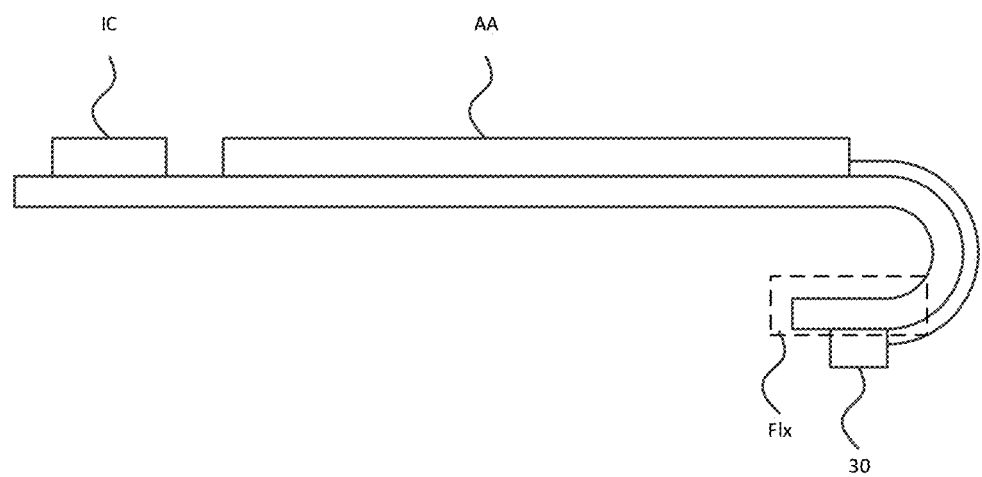
FIG. 6 is a schematic diagram of a display panel according to an embodiment of the present disclosure.

The switch unit 30 is arranged at an upper border of the display panel, and thus the upper border is widened, which is disadvantageous to achieving a narrow border of the display panel. FIG. 6 is a schematic diagram of a display panel according to an embodiment of the present disclosure. As shown in FIG. 6, the display panel is a flexible display panel, and the second side of the display area is provided with a bent portion Flx. The switch unit 30 is arranged at the bent portion Flx, and the bent portion Flx is folded to a non-light-exiting surface of the display panel. In this case, the switch unit 30 is invisible from a light-exiting side of the display panel, so that the upper border of the display panel can be narrowed.

Figure 7:
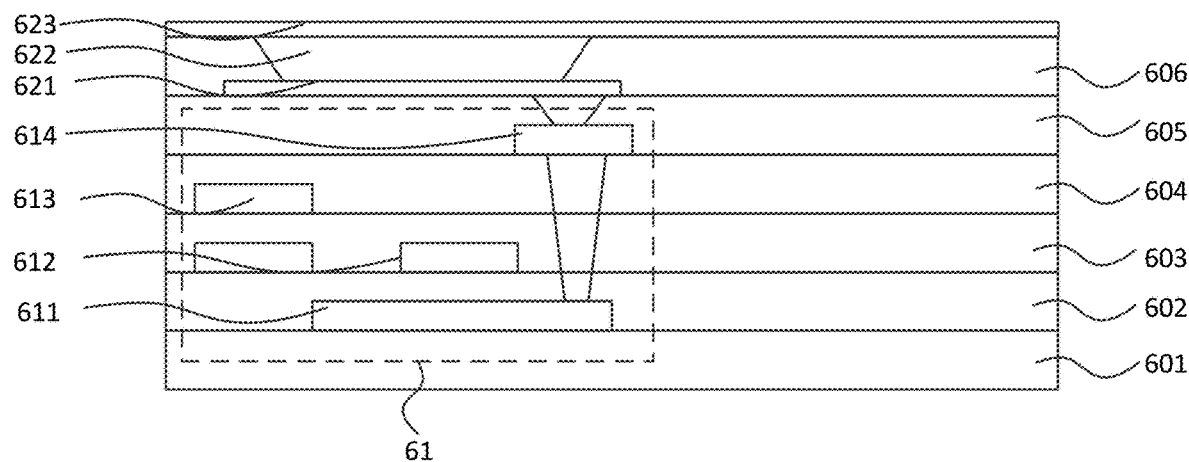
FIG. 7 is a schematic cross-sectional view of a display panel according to an embodiment of the present disclosure.

FIG. 7 is a schematic cross-sectional view of a display panel according to an embodiment of the present disclosure. A film layer stack structure of the display panel of the present disclosure will be described with reference to FIG. 7.

In this embodiment, the display panel includes a plurality of pixels and a plurality of pixel driving circuits 61 correspondingly connected to the plurality of pixels. The pixel includes an anode 621, a cathode 623, and a light-emitting material layer 622 arranged between the anode 621 and the cathode 623. Each driving circuit 61 is connected to the anode 621 of the corresponding pixel. The driving circuit 61 includes a transistor and a capacitor. The display panel includes a semiconductor layer 611, a gate insulation layer 602, a gate metal layer 612, a first interlayer insulation layer 603, a capacitor metal layer 613, a second interlayer insulation layer 604, a source and drain electrode metal layer 614, a planarization layer 605, an anode 621, a pixel definition layer 606, a light-emitting material layer 622, and a cathode 623 that are sequentially arranged above a substrate 601.

Figure 8:
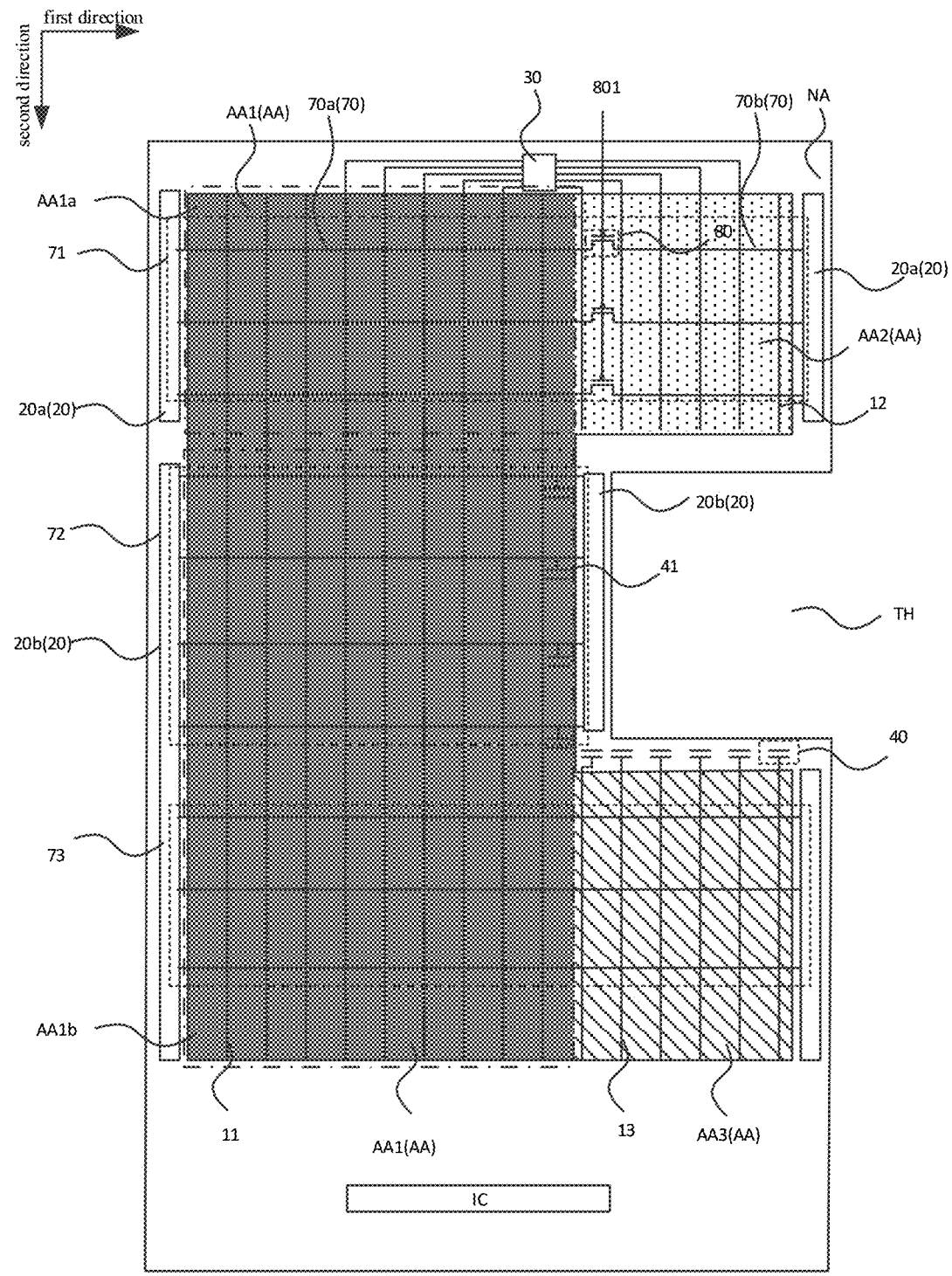
FIG. 8 is a schematic diagram of a display panel according to yet another embodiment of the present disclosure.
Figure 9:
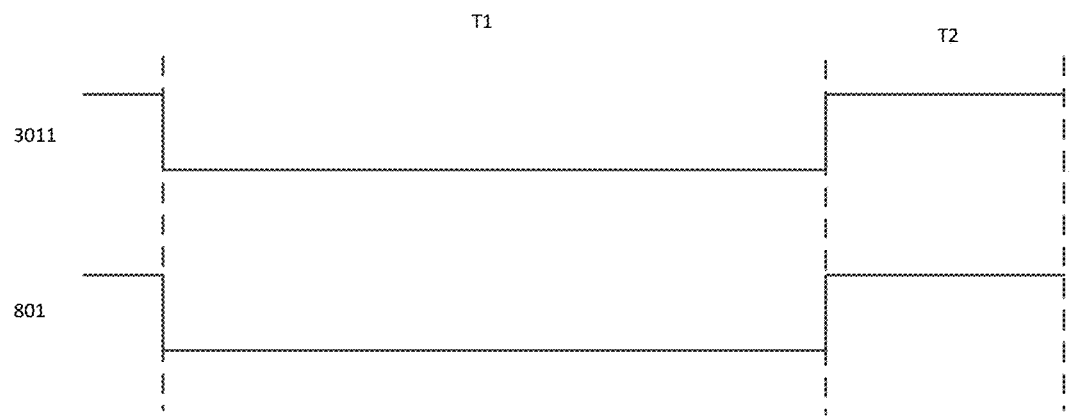
FIG. 9 is a time sequence diagram according to an embodiment of the present disclosure.

A method of driving the display panel will be described in the following with reference to the accompanying drawings. FIG. 8 is a schematic diagram of a display panel according to yet another embodiment of the present disclosure, and FIG. 9 is a time sequence diagram according to an embodiment of the present disclosure.

In an embodiment, the display panel includes: scan lines 70 extending along a first direction and arranged in a second direction, and data lines extending along the second direction and arranged in the first direction. The data lines include first data lines 11, second data lines 12, and third data lines 13.

In a first period T1, the switch unit 30 is turned on, and the second display area AA2 is driven.

In a second period T2, the switch unit 30 is turned off, and the first display area AA1 is driven; moreover, the third display area AA3 is driven together with the first display area AA1 in at least a partial period of the second period T2.

With reference to FIG. 3, FIG. 8 and FIG. 9, a PMOS transistor is taken as an example. In the first period T1, a control signal line 3011 transmits a low-level, and a data signal is transmitted from a driving chip IC to a corresponding second data line 12 through the first data line 11 and the switch unit 30, so as to drive the second display AA2. In the second period T2, the control signal line 3011 transmits a high-level, and a data signal is transmitted from the driving chip IC through the first data line 11, so as to drive the first display area AA1. In at least a partial period of the second period T2, the third data line 13 drives the third display area AA3. When a valid signal is input to the scan line corresponding to the third display area, the data signal is transmitted to the first display area AA1 and the third display area AA3 simultaneously through the first data line 11 and the third data line 13, so as to drive the first display area AA1 and the third display area AA3.

Further, with reference to FIG. 8, the first display area AA1 includes a first portion AA1a aligned with the second display area AA2 in the first direction, and a second portion AA1b. The scan lines 70 include a first set of scan lines 71, a second set of scan lines 72 and a third set of scan lines 73.

The first set of scan lines 71 are arranged in the first portion AA1a of the first display area AA1 and the second display area AA2. The second set of scan lines 72 are arranged in a part of the second portion AA1b of the first display area AA1 corresponding to the hollow area TH. The third set of scan lines 73 are arranged in a part of the second portion AA1b of the first display area corresponding to the third display area AA3. The number of pixels connected to the second set of scan lines 72 is smaller than the number of pixels connected to the first set of scan lines 71, and the number of the pixels connected to the second set of scan lines 72 is smaller than pixels connected to the third set of scan lines 73. This would cause a load difference among the scan lines 70. The load difference would affect an effective width of the scan line and a voltage value of an effective level, thereby affecting writing of data signals or causing technical problems, e.g., color is deviated or it is not dark in a dark state. Therefore, in this embodiment, the second set of scan lines 72 is connected to load compensation portions 41.

Further referring to FIG. 8, although the switch unit 30 is turned off and the data signal cannot be transmitted to the second display area AA2 in the second period T2, if the scan line 70 in the second display area AA2 is at an effective level, a floating signal on the second data line 12 may still be written into the pixel circuit located in the second display area AA2. Therefore, in this embodiment, the display area has a third side adjacent to the first side and the second side, and a fourth side opposite to the third side. The hollow area is arranged at the third side to form a notch area. The notch area has a third edge adjacent to the first edge and the second edge. In the first direction, the first display area AA1 is close to the fourth side of the display area. The second display area AA2 is surrounded by the first display area AA1, the second edge of the notch area TH, and the second side of the display area. The third display area AA3 is surrounded by the first display area AA1, the first edge of the notch area TH, and the first side of the display area. The scan lines include second scan lines 70b located in the second display area, and first scan lines 70a located in extending lines of the second scan lines 70b and located in the first display area. The first scan lines 70a are electrically insulated from the second scan lines 70b. This can prevent an invalid signal on the second data line 12 from being written into the pixel circuit located in the second display area AA2 in the second period T2.

Further, since the first scan lines 70a need to be insulated from the second scan lines 70b only in the second period T2, an insulation control transistor 80 may be provided between the first scan lines 70a and the second scan lines 70b. With reference to the time sequence shown in FIG. 9, in the first period T1, a control terminal signal line 801 of the insulation control transistor 80 inputs a low-level signal, and two gate driving circuits 20 located at the third side and the fourth side of the display panel simultaneously perform driving to maintain a strong driving capability; and in the second period T2, the control signal line 801 of the insulation control transistor 80 inputs a high-level signal, thereby preventing an invalid signal on the second data line 12 from being written into the pixel circuit located in the second display area AA2 in the second period T2.

Figure 10:
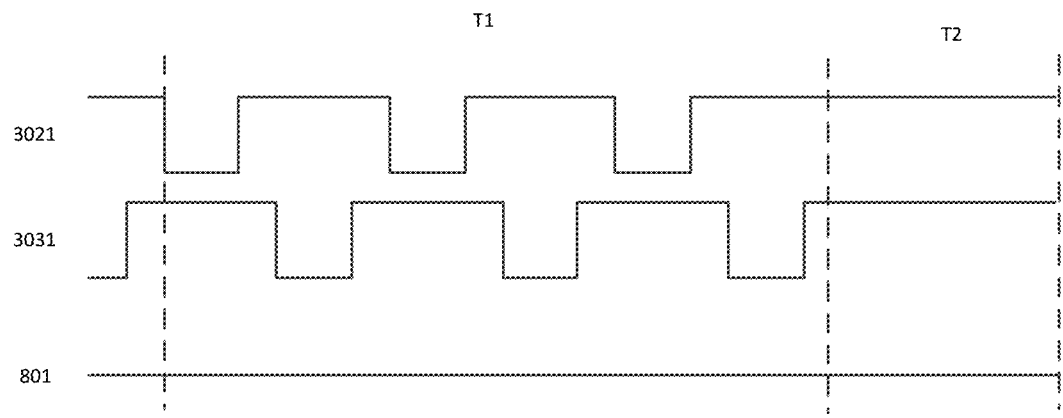
FIG. 10 is a time sequence diagram according to another embodiment of the present disclosure.

Further referring to FIG. 4, FIG. 8 and FIG. 10, the switch unit 30 in the present embodiment may be a multi-path switch unit as shown in FIG. 4.

The switch unit 30 includes a plurality of multi-path switch units 31, and one multi-path switch unit 31 includes n transistors. One first data line 11 is connected to n second data lines 12 through one multi-path switch unit 31. The multi-path switch unit 31 includes n transistors and n control signal lines. The n transistors each have a first terminal connected to a same first data line 11, a second terminal connected to a respective second data line 12, and a control terminal connected to a respective control signal line. Here, n is an integer larger than or equal to 2. Reference to the foregoing embodiments may be made for details, which will not be further described herein.

In this embodiment, a driving method is provided. In the first period T1, the switch unit 30 is turned on in a time division manner, and one first data line 11 provides a data signal to the second data lines 12 in a time division manner. According to the method of this embodiment, one first data line 11 can transmit a data signal to the second data lines through the switch unit 30 in a time division manner, so that this embodiment is applicable to a broad range of a size of the notch area.

With reference to the time sequence shown in FIG. 10, in the first period T1, the second control signal line 3021 and the third control signal line 3031 alternately transmit valid signal pulses, so that one first data line 11 transmits a data signal to two second data lines 12 in a time division manner. It should be noted that in this embodiment, the control terminal signal line 801 of the insulation control transistor 80 continuously outputs a high-level signal in the first period T1 and the second period T2, so that the first scan lines 70a are insulated from the second scan lines 70b.

Further, the non-display area of the display panel is provided with a first driving circuit 20a for driving the second display area, and second driving circuits 20a and 20b for driving the first display area. Here, the first driving circuit 20a is reused as a part of the second driving circuits. The first driving circuit 20a includes a first start signal and a first clock signal. The second driving circuit 20b includes a second start signal and a second clock signal. In the first period T1, the first start signal and the first clock signal are provided to the first driving circuit, and the first driving circuit performs driving row by row. In the second period T2, the second start signal and the second clock signal are provided to the second driving circuit, and the second driving circuit performs driving row by row. This can reduce a total number of driving circuits, thereby reducing an area of the border area occupied by the driving circuits and thus reducing the border width.

Further, a width of an effective level of the first start signal is larger than a width of an effective level of the second start signal, and a cycle of the first clock signal is twice a cycle of the second clock signal.

The data signal is written when the scan line 70 provides an effective level. However, an effective level provided by one scan line in the second display area AA2 requires that at least two data signals are written in a time divisional manner. Therefore, a width of the effective level of the scan signal required by the second display area AA2 is at least twice that of the other display area. If the entire display area adopts such a width of the effective level, time for scanning the entire display panel will be doubled, which will reduce the number of frames of the display panel. Taking a display panel with a 1920*1080 resolution at 60 frames per second as an example, each frame lasts for 16.7 ms, and the time (the width of the effective level) for scanning each row is shorter than or equal to 16.7 ms/1920≈8.7 μs. On one hand, in the second display area AA2, the data signal needs to be written into two second data lines 12 in a time division manner during the time for scanning one row; and on the other hand, it takes a minimum time, for example 5 μs, to allow the data signal to be sufficiently written. Therefore, in this case, the time for scanning each row in the second display area AA2 has to be longer than or equal to 10 μs. If each row is scanned in this time, an overall frame rate for the display penal will be 1 s/(10 μs*1920)=52 frames, which is lower than 60 frames and thus will affect an image quality of the display panel.

In this embodiment, the width of the effective level of the first start signal is larger than the width of the effective level of the second start signal, and the cycle of the first clock signal is twice the cycle of the second clock signal. In this case, time for scanning the second display area is increased while time for scanning the first display area is not increased. Taking a display panel with a 1920*1080 resolution as an example, if the second display area AA2 has x rows, the second portion AA1b of the first display area has (1920−x) rows. The time for scanning each of the x rows is 10 μs, and the time for scanning each of the (1920−x) rows is 5 μs. Then, the total time of scanning one frame is 10x+1920*5-5x=5*(1920+x)μs. If the frame rate for the display panel is higher than 60 frames, it is required to satisfy 5*(1920+x)μs≤16.7 ms, i.e., x≤1420. That is, taking a display panel with a 1920*1080 resolution as an example, if it is needed to maintain 60 frames, according to the driving method in this embodiment, the number of rows in the second display area AA2 needs to be smaller than 1420. In other words, according to the driving method in this embodiment, the display panel of the present disclosure can achieve driving at a high frame rate. In this embodiment, n=2 is taken as an example, and the cycle of the first clock signal is twice the cycle of the second clock signal. When n=3, the cycle of the first clock signal is three times the cycle of the second clock signal, and so on.

Figure 11:
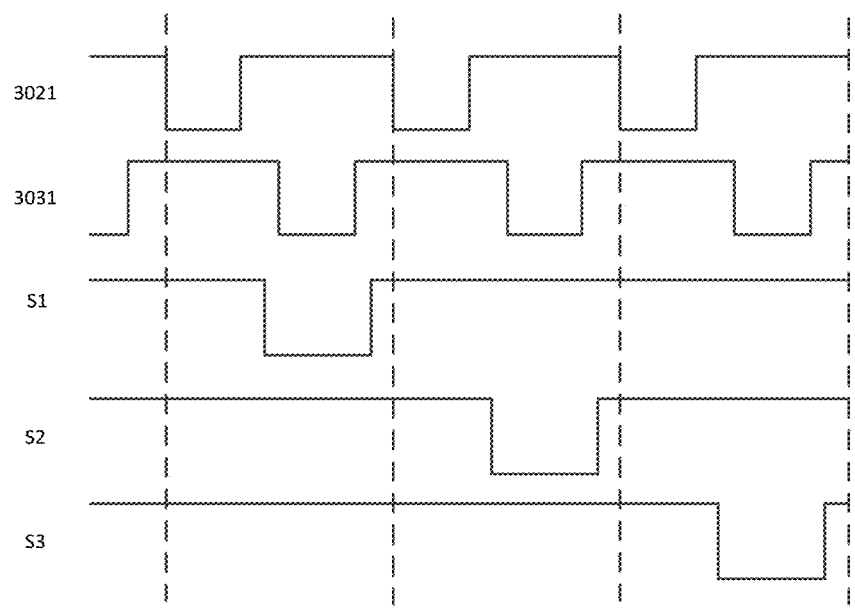
FIG. 11 is a time sequence diagram according to still another embodiment of the present disclosure.

FIG. 11 is a time sequence diagram according to still another embodiment of the present disclosure.

In another embodiment of the present disclosure, with reference to FIG. 4, FIG. 8, and FIG. 11, the multi-path switch unit 31 includes a second transistor 302 and third transistor 303, the second transistor 302 and the third transistor 303 each have a first terminal connected to a same first signal line 11, a second terminal respectively connected to a second data line 12c in a third set of second data lines 12c and a second data line 12d in a fourth set of second data lines 12d, and a control terminal respectively connected to two different control signal lines, i.e., a second control signal line 3021 and a third control signal line 3031.

With reference to FIG. 11, the second control signal line 3021 and the third control signal line 3031 alternatively output an effective level. S1, S2 and S3 shown in FIG. 11 represent scan signals for a first row, a second row and a third row, respectively. When the second control signal line 3021 or the third control signal line 3031 is at an effective level, the data signal is transmitted to the data line. When the scan signal is at an effective level, the data signal is written into a driving transistor. Taking the scan signal S1 for the first row as an example, it is assumed that low levels of the signal S1 cover the effective levels of the second control signal line 3021 and the third control signal line 3031, when the second control signal line 3021 is at an effective level, a data signal is written into a driving transistor connected to the second data line 12c in the third set of second data lines 12c, while no data signal is written into the second data line 12d in the fourth set of second data lines 12d corresponding to the third control signal line 3031 and thus no data signal is written into a driving transistor connected thereto. When the third control signal line 3031 is at an effective level, due to a parasitic capacitance of the second data line 12c in the third set of second data lines 12c, a data signal is continuously written into a driving transistor connected to the second data line 12c in the third set of second data lines 12c, while a data signal is also written into the second data line 12d in the fourth set of second data lines 12d. Therefore, it can be seen that the time during which a data signal is written into the driving transistor connected to the second data line 12c in the third set of second data lines 12c is longer than the time during which a data signal is written into the driving transistor connected to the second data line 12d in the fourth set of second data lines 12d, which would result in the abnormal display. However, when the effective level of the first scan signal S1 occurs after the effective level of the second control signal line 3021 and the third control signal line 3031, the time during which a data signal is written into the driving transistor connected to the second data line 12c in the third set of second data lines 12c is the same as the time during which a data signal is written into the driving transistor connected to the second data line 12d in the fourth set of second data lines 12d, but at this time, one scan cycle is separated from another by the effective levels of the second control signal line 3021 and the third control signal line 3031 and the effective level of the first scan signal S1. In this way, the large time interval can reduce the frame rate for the display panel.

In an embodiment of the present disclosure, an effective level of the third control signal line 3031 occurs after an effective level of the second control signal line 3021, the effective level of the second control signal line 3021 does not overlap an effective level of the scan line, and the effective level of the scan line covers the effective level of the third control signal line 3031. In this case, when the second control signal line 3021 is at an effective level, a data signal is written into the second data line 12c in the third set of second data lines 12c, but the signal is not written into the driving transistor, and no data signal is written into the second data line 12d in the fourth set of second data lines 12d. When the third control signal line 3031 is at an effective level, a data signal is continuously written into the driving transistor connected to the second data line 12c in the third set of second data lines 12c due to the parasitic capacitance of the second data line 12c in the third set of second data lines 12c, and a data signal is also written into the second data line 12d in the fourth set of second data lines 12d. Therefore, the time during which a data signal is written into the driving transistor connected to the second data line 12c in the third set of second data lines 12c is the same as the time during which a data signal is written into the driving transistor connected to the second data line 12d in the fourth set of second data lines 12d, thereby avoiding the abnormal display.

On the other hand, in this embodiment, instead of requiring the data signal to be transmitted in a time division manner during the scanning period, scanning is performed in two periods and the data signals are transmitted respectively, so that the scanning time of each stage is the same and thus it is not necessary to set different widths for the effective levels of different scan signals based on different areas, thereby greatly reducing complexity of the IC.

Figure 12:
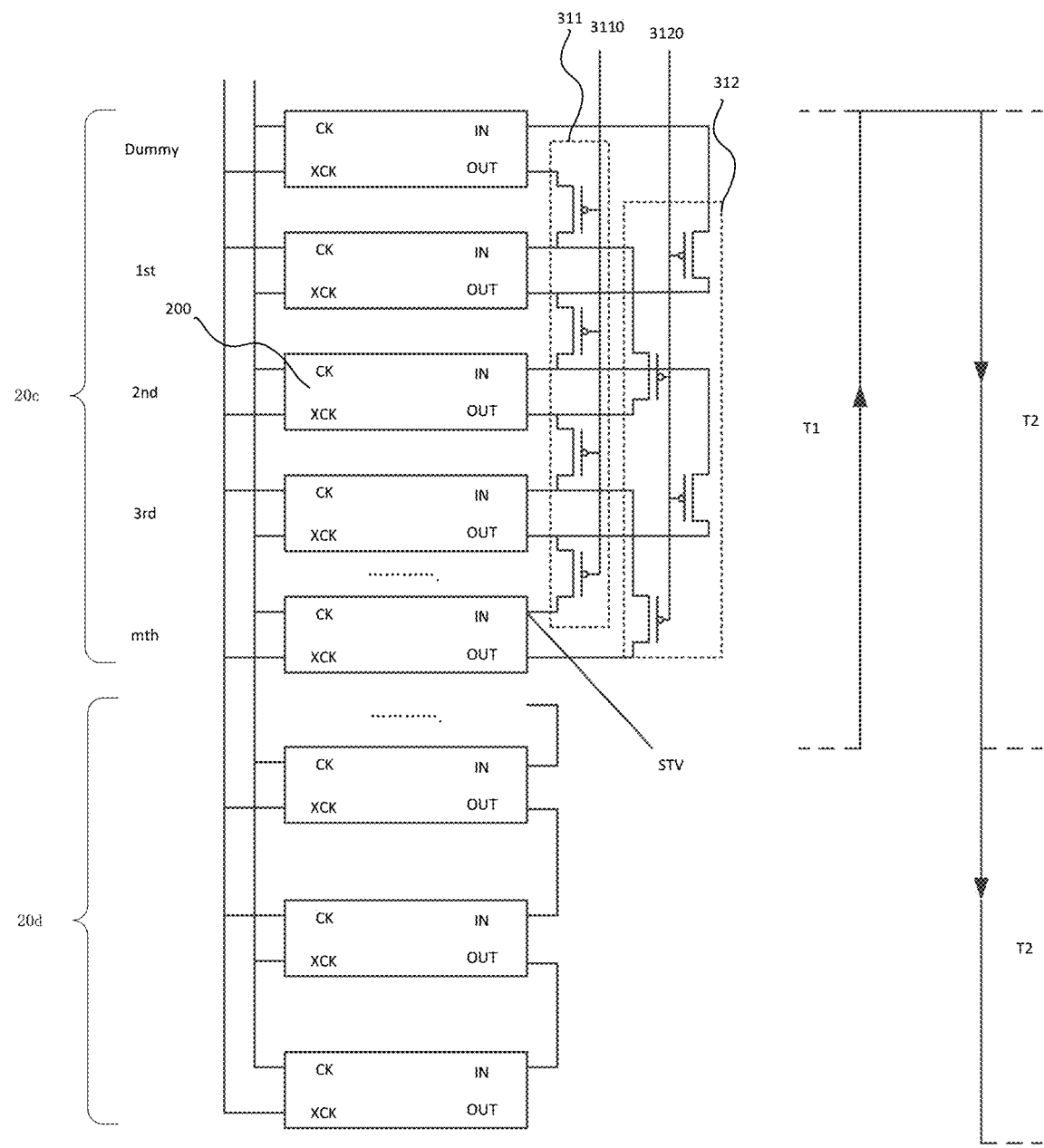
FIG. 12 is a schematic diagram of driving circuits of a display panel according to an embodiment of the present disclosure.
Figure 13:
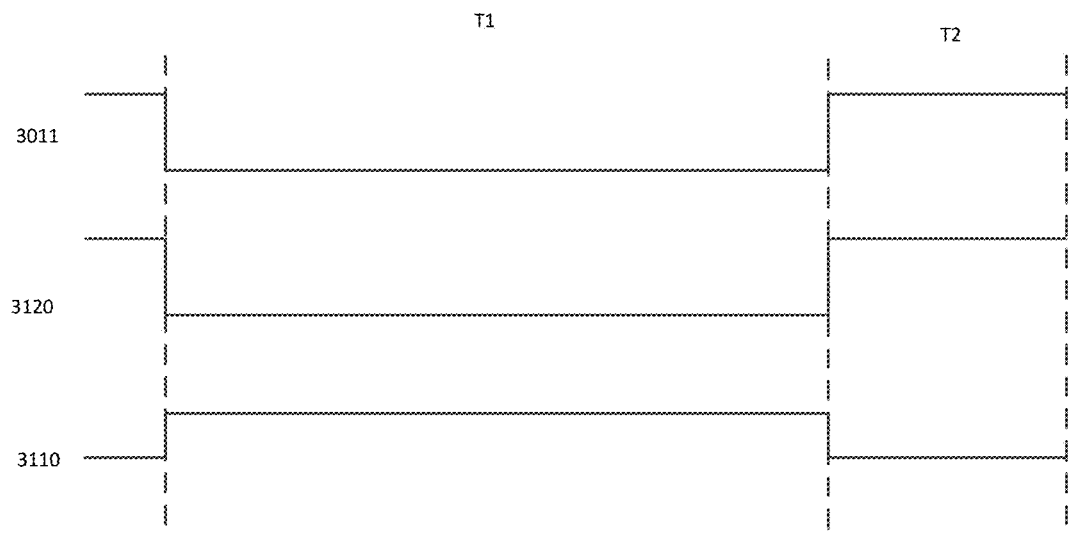
FIG. 13 is a time sequence diagram according to yet another embodiment of the present disclosure.

FIG. 12 is a schematic diagram of driving circuits of a display panel according to an embodiment of the present disclosure, and FIG. 13 is a time sequence diagram according to yet another embodiment of the present disclosure.

The first display area AA1 includes a first portion AA1 aligned with the second display area AA2 in the first direction, and a second portion AA1b. The non-display area of the display panel is provided with a third driving circuit 20c for driving the first portion AA1a of the first display area and the second display area AA2, and a fourth driving circuit 20d for driving the second portion AA1b of the first display area and the third display area AA3.

In the first period T1, the third driving circuit 20c outputs a driving signal stage by stage in a direction from the second edge of the notch area TH towards the second side of the display area AA.

In the second period T2, the third driving circuit 20c and the fourth driving circuit 20d output driving signals stage by stage in a direction from the second side of the display area AA towards the second edge of the notch area TH.

It should be noted that, in the first period T1, the third driving circuit 20c is only used to drive the second display area AA2, but since the data signal in the second display area AA2 is transmitted by a part of the first data lines 11 in the first display area, and the first data line 11 and the scan line in the first display area simultaneously provide signals in the first period T1, the same signal as that of the second display area will be written into a part of the first display area that shares a scan signal line with the second display area (with a same row) and is connected to the second data line 12 through the switch unit 30. In the second period T2, a correct data signal will be rewritten into the corresponding part of the first display area through a scan signal provided by the first data line 11 and the third driving circuit 20c. At this time, since the switch unit is turned off, the written data signal does not affect the second display area. In view of this, with the switch unit in this embodiment, the present disclosure can avoid data interference caused by reusing a data line.

In this embodiment, one third driving circuit 20c can achieve scanning in two periods by forward scanning and reverse scanning, thereby reducing the number of driving circuits and achieving a display panel with a narrow border. Moreover, by firstly reverse-scanning and then forward-scanning, the second period T2 immediately follows the first period T1, and there is no need to separately provide a start signal in the second period T2.

Further, a conventional driving circuit cannot perform forward scanning and reverse scanning at the same time. With reference to FIG. 12, in an embodiment of the present disclosure, the third driving circuit includes a $1^{st}$ stage of third driving circuit unit 200 to an $m^{th}$ stage of third driving circuit unit 200 in a direction from the second edge of the notch area TH towards the second side of the display area. The third driving circuit unit 200 includes an output terminal OUT and an input terminal IN. The output terminal OUT of an $i^{th}$ stage of third driving circuit unit 200 is connected to the input terminal IN of a $(i+1)^{th}$ stage of third driving circuit unit 200 through a forward-scanning switching unit 311, and the output terminal OUT of the $(i+1)^{th}$ stage of third driving circuit unit 200 is connected to the input terminal IN of the $i^{th}$ stage of third driving circuit unit 200 through a reverse-scanning switching unit 312, where i∈[1, m−1] and i is an integer. In this way, when performing the forward scanning, the forward-scanning switching unit receives an effective level and the reverse-scanning switching unit receives a cut-off level, so that the third driving circuit performs forward scanning. Similarly, when it is needed to perform the reverse scanning, the reverse-scanning switching unit receives an effective level and the forward-scanning switching unit receives a cut-off level, so that the third driving circuit performs the reverse scanning. In particular, in the first period T1, a reverse-scanning control signal line 3120 provides an effective level and a forward-scanning control signal line 3110 provides a cut-off level, so that the reverse-scanning switching unit receives an effective level and the forward-scanning switching unit receives a cut-off level, and then the third driving circuit performs the reverse scanning. In the second period T2, the forward-scanning control signal line 3110 provides an effective level and the reverse-scanning control signal line 3120 provides a cut-off level, so that the forward-scanning switching unit receives an effective level and the adverse-scanning switching unit receives a cut-off level, and then the third driving circuit performs the forward scanning.

Further, the forward scanning and the reverse scanning generally require separate start signals, requiring an additional start signal line. Moreover, the driving circuit needs to perform timing sequence matching so that a start signal for starting the forward scanning is inputted just after the reverse scanning has completed. Such timing sequence matching is very difficult. Therefore, an embodiment of the present disclosure provides a technical solution, in which a dummy third driving circuit unit Dummy is arranged to precede the $1^{st}$ stage of third driving circuit unit 200. The dummy third driving circuit unit Dummy has an input terminal IN connected to the output terminal OUT of the $1^{st}$ stage of third driving circuit unit through the reverse-scanning switching unit 312, and an output terminal OUT connected to the input terminal IN of the $1^{st}$ stage of third driving circuit unit through the forward-scanning switching unit 311.

The driving method in this embodiment will be described in the following with reference to FIG. 3, FIG. 12, and the time sequence shown in FIG. 13.

In the first period T1, the control signal line 3011 of the switch unit 30 as shown in FIG. 3 transmits an effective level, the forward-scanning control signal line 3110 outputs a cut-off level, and the reverse-scanning control signal line 3120 outputs an effective level. At this time, data signals are transmitted to the second data lines that drive the second display area AA2 through a part of the first data lines 11 and the switch unit 30, so as to drive the second display area AA2 to perform displaying.

In the second period T2, the control signal line 3011 of the switch unit 30 as shown in FIG. 3 transmits a cut-off level, the forward-scanning control signal line 3110 outputs an effective level, and the reverse-scanning control signal line 3120 outputs a cut-off level. At this time, the first display area AA1 is driven by the data signals through the first data lines 11. In a partial period of the second period T2, the second display area AA2 is also driven by the third data lines 13.

In this embodiment, it can be seen that the signals of the control signal line 3011 and the forwarding-scanning control signal line 3120 have same waveforms and can be reused. Therefore, the number of signal lines can be reduced, and thus the layout difficulty can be reduced, which is advantageous for achieving a narrow border.

Figure 14:
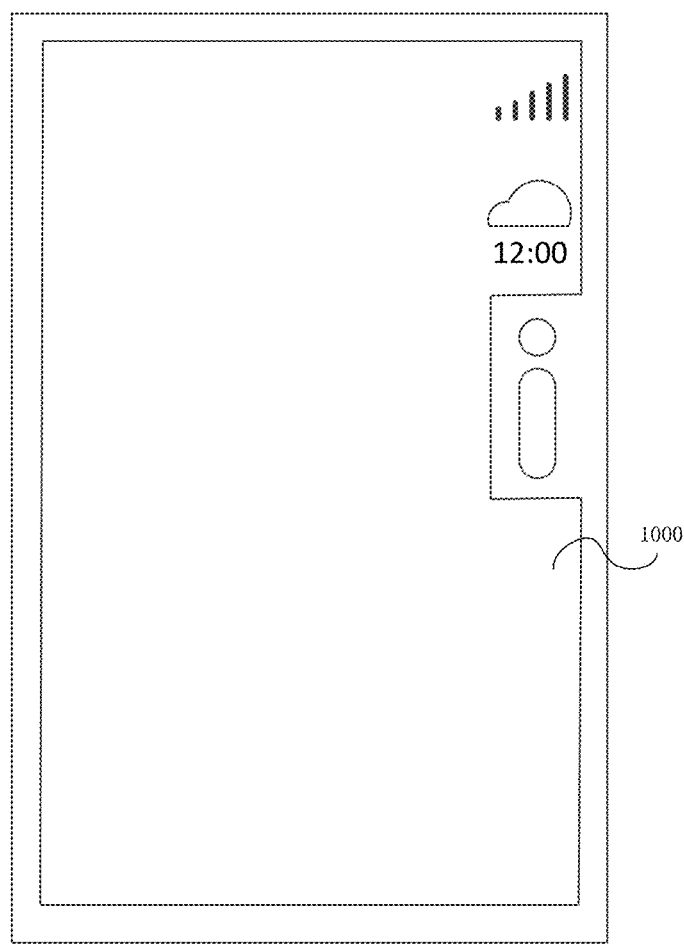
FIG. 14 is a schematic diagram of a display device according to yet another embodiment of the present disclosure.

FIG. 14 is a schematic diagram of a display device according to an embodiment of the present disclosure. With reference to FIG. 14, an embodiment of the present disclosure further provides a display device, and the display device may include the display panel described above. The display device includes, but not limited to, a cellular mobile telephone, a tablet computer, a display of a computer, a display applied on a smart wearable device, a display device applied on a vehicle such as a car, and the like. As long as the display device includes the display panel included in the display device disclosed in the present disclosure, it shall fall within the scope of the present disclosure.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, having a display area and a non-display area surrounding the display area, wherein the display area has a first side and a second side opposite to the first side, and the display area comprises:
    a hollow area having a first edge and a second edge;
    a first display area extending from the first side of the display area to the second side of the display area;
    a second display area extending from the second edge of the hollow area to the second side of the display area; and
    a third display area extending from the first side of the display area to the first edge of the hollow area,
    wherein the display panel comprises:
    a driving chip arranged in the non-display area closer to the first side of the display area than to the second side of the display area;
    first data lines arranged in the first display area;
    second data lines arranged in the second display area; and
    third data lines arranged in the third display area,
    wherein the first edge of the hollow area is closer to the driving chip than the second edge of the hollow area, and wherein at least one or more of the first data lines is connected to corresponding one or more of the second data lines through a switch unit, and the switch unit is configured to transmit a data signal through the first data line to the second data line in a time division manner.

2. The display panel according to claim 1, further comprising compensation capacitors connected to the third data lines, wherein each of the compensation capacitors has a capacitance of C1, a difference between a parasitic capacitance of each of the first data lines and a parasitic capacitance of each of the third data lines is C2, and $0.8*C2 \leq C1 \leq 1.2*C2$; the compensation capacitors are arranged at the first edge of the hollow area close to the third display area.

3. The display panel according to claim 2, wherein first connection lines are arranged between the first data lines and the second data lines, each of the first connection lines connects one first data line of the first data lines with a respective one of the second data lines connected to the one first data line, one of the first connection lines that connects one of the first data lines with a respective one of the second data lines that are close to a junction of the first display area and the second display area has a larger resistance than another of the first connection lines that connects another of the first data lines with a respective one of the second data lines that are away from the junction of the first display area and the second display area.

4. The display panel according to claim 1, wherein the switch unit comprises at least one switch transistor, and each of the at least one switch transistor has a first electrode connected to a respective one of the first data lines, a second electrode connected to a respective one of the second data lines, and a gate electrode connected to a same control signal line.

5. The display panel according to claim 4,
    wherein the first data lines comprise a first set of first data lines and a second set of first data lines, a first data line in the first set of first data lines and a first data line in the second set of first data lines are alternately arranged in a first direction intersecting with an extending direction of the first data lines, and the first set of first data lines and the second set of first data lines are connected to pixels of different colors;

the second data lines comprise a first set of second data lines and a second set of second data lines, a second data line in the first set of second data lines and a second data line in the second set of second data lines are alternately arranged in the first direction, and the first set of second data lines and the second set of second data lines are connected to pixels of different colors;

a second data line in the first set of second data lines is correspondingly connected to a corresponding first data line in the first set of first data lines through the at least one switch transistor, and the second set of second data lines are connected to the second set of first data lines through the at least one switch transistors; and the first set of second data lines and the first set of first data lines are connected to pixels of a same color; and the second set of second data lines and the second set of first data lines are connected to pixels of a same color.

6. The display panel according to claim 1, wherein the switch unit comprises at least one multi-path switch unit, and each of the at least one multi-path switch unit comprises n transistors and n control signal lines; and one of the first data lines is connected to n second data lines of the second data lines through a respective multi-path switch unit of the at least one multi-path switch unit; and each of the n transistors has a first terminal connected to a same one of the first data lines, a second terminal connected to a respective one of the second data lines, and a control terminal connected to a respective one of the n control signal lines, where n is an integer greater than or equal to 2.

7. The display panel according to claim 6, wherein the first data lines comprise a first set of first data lines and a second set of first data lines alternately arranged in a first direction intersecting with an extending direction of the first data lines, and the first set of first data lines and the second set of first data lines are connected to pixels of different colors;

the second data lines comprise a first set of second data lines and a second set of second data lines alternately arranged in the first direction, and the first set of second data lines and the second set of second data lines are connected to pixels of different colors;

n second data lines of the first set of second data lines are connected to a respective one first data line of the first set of first data lines through a respective multi-path switch unit of the at least one multi-path switch unit, and n second data lines of the second set of second data lines are connected to a respective one first data line of the second set of first data lines through a respective multi-path switch unit of the at least one multi-path switch unit; and the first set of second data lines and the first set of first data lines are connected to pixels of a same color, and the second set of second data lines and the second set of first data lines are connected to pixels of a same color.

8. The display panel according to claim 1, wherein the display panel is a flexible display panel, the second side of the display area is provided with a bent portion, the switch unit is arranged at the bent portion, and the bent portion is folded to a non-light-exiting surface of the display panel.

9. The display panel according to claim 1, wherein the display area further has a third side adjacent to the first side and the second side of the display area, and a fourth side opposite to the third side; and the hollow area is arranged at the third side.

10. The display panel according to claim 1,
wherein the display area further has a third side adjacent to the first side and the second side of the display area, and a fourth side opposite to the third side;
the hollow area is arranged in a middle area of the display area to form a non-display hole; and
a third set of first data lines is provided at a first side of the non-display hole, a fourth set of first data lines is provided at a second side of the non-display hole; and the third set of first data lines and the fourth set of first data lines are correspondingly connected to the second data lines through the switch unit respectively; and the first side of the non-display hole is opposite to the second side of the non-display hole.

11. The display panel according to claim 1, further comprising scan lines extending along a first direction and arranged in a second direction, and data lines extending along the second direction and arranged in the first direction;
in a first period, the switch unit is turned on and the second display area is driven; and
in a second period, the switch unit is turned off and the first display area is driven; and the third display area is driven together with the first display area at least in a partial period of the second period.

12. The display panel according to claim 11,
wherein the first display area comprises a first portion aligned with the second display area in the first direction, and a second portion;
the scan lines comprise a first set of scan lines, a second set of scan lines, and a third set of scan lines; the first set of scan lines is arranged in the first portion of the first display area and the second display area, the second set of scan lines is arranged in a part of the second portion of the first display area corresponding to the hollow area, and the third set of scan lines is arranged in a part of the second portion of the first display area corresponding to the third display area;
a number of pixels connected to the second set of scan lines is smaller than a number of pixels connected to the first set of scan lines and a number of pixels connected to the third set of scan lines; and
the second set of scan lines is connected to load compensation units.

13. The display panel according to claim 11,
wherein the display area has a third side adjacent to the first side and the second side of the display area, and a fourth side opposite to the third side; the hollow area is arranged at the third side; and the hollow area has a third edge adjacent to both the first edge and the second edge;
in the first direction, the first display area is closer to the fourth side of the display area than to the third side of the display area; the second display area is surrounded by the first display area, the second edge of the hollow area and the second side of the display area; and the third display area is surrounded by the first display area, the first edge of the hollow area and the first side of the display area; and
the scan lines comprise second scan lines located in the second display area and first scan lines located in extending lines of the second scan lines and located in the first display area; and the first scan lines are electrically insulated from the second scan lines.

14. The display panel according to claim 11, wherein the switch unit comprises at least one multi-path switch unit, and each of the at least one multi-path switch unit comprises n transistors and n control signal lines; and one of the first data lines is connected to n second data lines of the second data lines through a respective multi-path switch unit of the at least one multi-path switch unit;

the n transistors each have a first terminal connected to a same first data line, a second terminal connected to a respective one of the n second data lines, and a control terminal connected to a respective one of the n control signal lines, where n is an integer larger than or equal to 2; and in the first period, the switch unit is turned on in a time division manner, and one of the first data lines provides a data signal to the n second data lines in a time division manner.

15. The display panel according to claim 14, wherein the non-display area of the display panel is provided with a first driving circuit for driving the second display area, and a second driving circuit for driving the first display area;

the first driving circuit is configured to be provided with a first start signal and a first clock signal, and the second driving circuit is configured to be provided with a second start signal and a second clock signal;

in the first period, the first start signal and the first clock signal are provided to the first driving circuit, and the first driving circuit performs driving row by row; and in the second period, the second start signal and the second clock signal are provided to the second driving circuit, and the second driving circuit performs driving row by row; and the first driving circuit is reused as a part of the second driving circuit.

16. The display panel according to claim 15, wherein a width of an effective level of the first start signal is larger than a width of an effective level of the second start signal, and a cycle of the first clock signal is n times a cycle of the second clock signal.

17. The display panel according to claim 14, wherein each of the at least one multi-path switch unit comprises a second transistor and a third transistor;

a first electrode of the second transistor and a first electrode of the third transistor are both connected to one of the second data lines;

the second transistor has a second electrode connected to one second data line of a third set of second data lines, and the third transistor has a second electrode connected to one second data line of a fourth set of third data lines;

the second transistor has a gate electrode connected to a second control signal line, and the third transistor has a gate electrode connected to a third control signal line; and an effective level of the third control signal line occurs after an effective level of the second control signal line, the effective level of the second control signal line does not overlap an effective level of the scan line, and the effective level of the scan line covers the effective level of the third control signal line.

18. The display panel according to claim 11, wherein the first display area comprises a first portion aligned with the second display area in the first direction, and a second portion;

the non-display area of the display panel is provided with a third driving circuit for driving the first portion of the first display area and the second display area, and a fourth driving circuit for driving the second portion of the first display area and the third display area;

in the first period, the third driving circuit outputs a driving signal stage by stage in a direction from a second edge of the hollow area towards the second side of the display area; and in the second period, the third driving circuit and the fourth driving circuit output driving signals stage by stage in a direction from the second side of the display area towards the second edge of the hollow area.

19. The display panel according to claim 18, wherein the third driving circuit comprises a $1^{st}$ stage of third driving circuit unit to an $m^{th}$ stage of third driving circuit unit in the direction from the second edge of the hollow area towards the second side of the display area; each of the $1^{st}$ to $m^{th}$ stages of third driving circuit units has an output terminal and an input terminal; and the output terminal of an $i^{th}$ stage of third driving circuit unit is connected to the input terminal of a $(i+1)^{th}$ stage of third driving circuit unit through a forward-scanning switching unit; the output terminal of the $(i+1)^{th}$ stage of third driving circuit unit is connected to the input terminal of the $i^{th}$ stage of third driving circuit unit through a reverse-scanning switching unit, where i∈[1, m−1], and i is an integer.

20. The display panel according to claim 19, wherein a dummy third driving circuit unit is arranged to precede the $1^{st}$ stage of third driving circuit unit; the dummy third driving circuit unit has an input terminal connected to the output terminal of the $1^{st}$ stage of third driving circuit unit through the reverse-scanning switching unit, and an output terminal connected to the input terminal of the $1^{st}$ stage of third driving circuit unit through the forward-scanning switching unit.

21. A display device, comprising a display panel having a display area and a non-display area surrounding the display area, wherein the display area has a first side and a second side opposite to the first side, and the display area comprises:

a hollow area having a first edge and a second edge;

a first display area extending from the first side of the display area to the second side of the display area;

a second display area extending from the second edge of the hollow area to the second side of the display area; and a third display area extending from the first side of the display area to the first edge of the hollow area, wherein the display panel comprises:

a driving chip arranged in the non-display area closer to the first side of the display area than to the second side of the display area;

first data lines arranged in the first display area;

second data lines arranged in the second display area; and third data lines arranged in the third display area, wherein the first edge of the hollow area is closer to the driving chip than the second edge of the hollow area, and wherein at least one or more of the first data lines is connected to corresponding one or more of the second data lines through a switch unit, and the switch unit is configured to transmit a data signal through the first data line to the second data line in a time division manner.

* * * * *